United States Patent
Shank et al.

(10) Patent No.: US 10,156,676 B1
(45) Date of Patent: Dec. 18, 2018

(54) WAVEGUIDES WITH MULTIPLE AIRGAPS ARRANGED IN AND OVER A SILICON-ON-INSULATOR SUBSTRATE

(71) Applicant: GLOBALFOUNDRIES Inc., Grand Cayman (KY)

(72) Inventors: Steven M. Shank, Jericho, VT (US); Siva P. Adusumilli, South Burlington, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/905,134

(22) Filed: Feb. 26, 2018

(51) Int. Cl.
| | |
|---|---|
| *G02B 6/122* | (2006.01) |
| *G02B 6/13* | (2006.01) |
| *G02B 6/136* | (2006.01) |
| *G02B 6/12* | (2006.01) |
| *H01L 31/0232* | (2014.01) |
| *H01L 31/113* | (2006.01) |

(52) U.S. Cl.
CPC .............. *G02B 6/122* (2013.01); *G02B 6/131* (2013.01); *G02B 6/136* (2013.01); *H01L 31/02327* (2013.01); *H01L 31/1136* (2013.01); *G02B 2006/12061* (2013.01)

(58) Field of Classification Search
CPC ........ G02B 6/122; G02B 6/136; G02B 6/131; G02B 2006/12061; G02B 6/12; G02B 6/12002; G02B 2006/12097; H01L 31/02327; H01L 31/1136; H01L 31/0232; H01L 31/0256; H01L 31/0352
See application file for complete search history.

(56) References Cited

U.S. PATENT DOCUMENTS

| | | |
|---|---|---|
| 6,928,879 B2 | 8/2005 | Partridge et al. |
| 7,009,273 B2 | 3/2006 | Inoh et al. |

(Continued)

OTHER PUBLICATIONS

Adusumilli et al., "Sealed Cavity Structures with a Planar Surface" filed Jan. 22, 2018 as U.S. Appl. No. 15/876,727.

(Continued)

*Primary Examiner* — John M Bedtelyon
(74) *Attorney, Agent, or Firm* — Thompson Hine LLP; Yee Tze Lim

(57) ABSTRACT

Waveguide structures and methods of fabricating waveguide structures. The waveguide structures are formed using a semiconductor substrate that includes a device layer, a handle wafer, a buried oxide layer between the handle wafer and the device layer, and an epitaxial semiconductor layer over the device layer. First and second trench isolation regions extend through the device layer and the epitaxial semiconductor layer. The first and second trench isolation regions are spaced to define a waveguide core region comprising a section of the device layer and a section of the epitaxial semiconductor layer that are arranged between the first and second trench isolation regions. A first airgap and a second airgap are respectively located in the device layer and the buried oxide layer. The first and second airgaps are arranged beneath the waveguide core region, and the first airgap may be arranged between the second airgap and the waveguide core region.

20 Claims, 14 Drawing Sheets

(56) References Cited

U.S. PATENT DOCUMENTS

| | | | |
|---|---|---|---|
| 7,920,770 B2* | 4/2011 | Holzwarth | B82Y 20/00 |
| | | | 385/129 |
| 8,927,386 B2 | 1/2015 | Wu et al. | |
| 9,046,650 B2 | 6/2015 | Lin et al. | |
| 9,059,252 B1* | 6/2015 | Liu | H01L 21/7682 |
| 9,385,022 B2 | 7/2016 | Jaffe et al. | |
| 9,984,936 B1* | 5/2018 | Xie | H01L 29/775 |
| 2006/0228864 A1 | 10/2006 | Chen et al. | |
| 2013/0210221 A1 | 8/2013 | Huang et al. | |

OTHER PUBLICATIONS

Miller et al., "Low-Loss Silicon Platform for Broadband Mid-Infrared Photonics", Optica 4, 707-712 (2017).

Chiles et al., "High-contrast, all-silicon waveguiding platform for ultra-broadband midinfrared photonics", Appl. Phys. Lett. 103, (2013).

Sorel, et al., "Silicon waveguided components for the long-wave infrared region", J. Opt. A: Pure Appl. Opt. 8 (2006) 840-848.

Shank et al., "Waveguides With Multiple-Level Airgaps", U.S. Appl. No. 15/905,165, filed Feb. 26, 2018.

* cited by examiner

WAVEGUIDES WITH MULTIPLE AIRGAPS ARRANGED IN AND OVER A SILICON-ON-INSULATOR SUBSTRATE

BACKGROUND

The present invention relates to photonics chips and, more specifically, to waveguide structures and methods of fabricating waveguide structures.

Photonic chips integrate optical components and electronic components into a single chip. Photonic chips are capable of being used in many applications and many systems including, but not limited to, data communication systems and data computation systems. The electronic components may include, for example, field-effect transistors, and the optical components may include waveguides. Layout area, cost, and operational overhead may be reduced by including both types of components on a single photonics chip.

On-chip communication and sensing may rely on transferring electromagnetic radiation through silicon waveguides in the mid-infrared wavelength range of 3 microns (μm) to 8 μm. The transparency window of silicon, when used as a waveguide material, extends to approximately 8 μm. However, silicon waveguides may experience signal loss because the silicon dioxide layer cladding the waveguide strongly absorbs electromagnetic radiation starting at a wavelength of 3.5 μm in the mid-infrared wavelength range.

Improved waveguide structures and methods of fabricating waveguide structures are needed.

SUMMARY

In an embodiment of the invention, a waveguide structure includes a semiconductor substrate including a device layer, a handle wafer, a buried oxide layer between the handle wafer and the device layer, and an epitaxial semiconductor layer over the device layer. First and second trench isolation regions extend through the device layer and the epitaxial semiconductor layer to the buried oxide layer. The first and second trench isolation regions are spaced to define a waveguide core region comprising a section of the device layer and a section of the epitaxial semiconductor layer that are arranged between the first and second trench isolation regions. A first airgap is located in the device layer or in the handle wafer, and a second airgap is located in the buried oxide layer. The first and second airgaps are each arranged beneath the waveguide core region.

In an embodiment of the invention, a structure includes a semiconductor substrate with a device layer, a handle wafer, a buried oxide layer arranged between the handle wafer and the device layer, and an epitaxial semiconductor layer over the device layer. A field-effect transistor includes a gate electrode on the epitaxial semiconductor layer. A first airgap is located in the device layer, and a second airgap is located in the buried oxide layer. The first airgap and the second airgap are each arranged under the field-effect transistor, and the first airgap is arranged between the second airgap and the field-effect transistor.

In an embodiment of the invention, a method is provided for forming a waveguide structure. The method includes providing a substrate including a device layer, a handle wafer, and a buried oxide layer arranged between the handle wafer and the device layer, and forming a first airgap in the device layer or in the handle wafer. After forming the first airgap, a second airgap is formed in the buried oxide layer. The method further includes epitaxially growing a semiconductor layer over the device layer, and forming first and second trench isolation regions each extending through the semiconductor layer and the device layer to the buried oxide layer. The first trench isolation region is spaced from the second trench isolation region to define a waveguide core region comprising a section of the device layer and a section of the semiconductor layer that are arranged between the first trench isolation region and the second trench isolation region. The first and second airgaps are arranged beneath the waveguide core region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
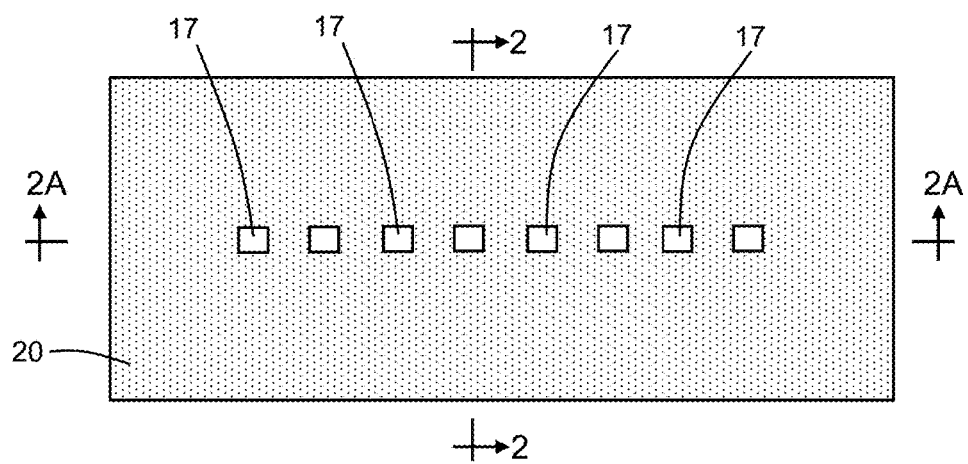
FIG. 1 is a top view of a structure at an initial fabrication stage of a processing method in accordance with embodiments of the invention.
Figure 2:
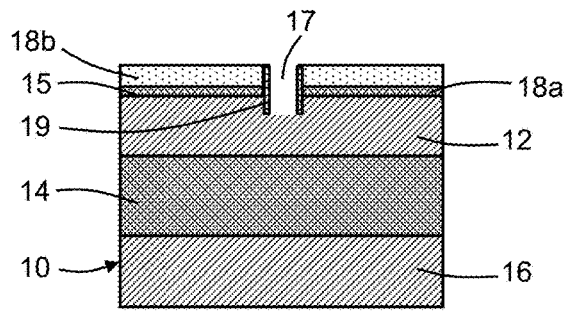
FIG. 2 is a cross-sectional view taken generally along line 2-2 in FIG. 1.
Figure 2A:
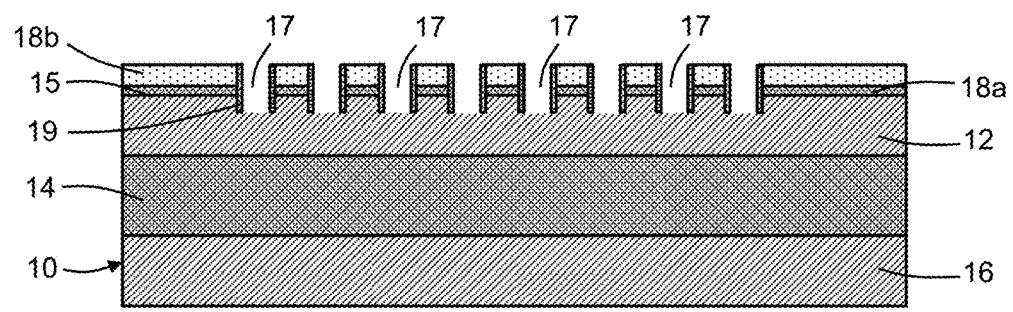
FIG. 2A is a cross-sectional view taken generally along line 2A-2A in FIG. 1.

With reference to FIGS. 1, 2, 2A and in accordance with embodiments of the invention, a semiconductor-on-insulator (SOI) substrate, generally indicated by reference numeral 10, includes a device layer 12, a buried oxide (BOX) layer 14, and a handle wafer 16. The device layer 12 is separated from the handle wafer 16 by the intervening BOX layer 14 and is considerably thinner than the handle wafer 16. The device layer 12 is electrically insulated from the handle wafer 16 by the BOX layer 14, which may be composed of an electrical insulator, such as silicon dioxide (e.g., $SiO_2$).

Pad layers 18a, 18b are formed over a top surface 15 of the device layer 12. The materials of the pad layers 18a, 18b may be chosen to etch selectively to the semiconductor material of the device layer 12 and to be readily removed at a subsequent fabrication stage. The pad layers 18a, 18b operate as protection layers for the top surface 15 of the device layer 12 during, for example, etching processes. Pad layer 18a may be composed of a dielectric material, such as silicon dioxide ($SiO_2$) deposited by chemical vapor deposition (CVD). Pad layer 18b may be composed of a dielectric material, such as silicon nitride ($Si_3N_4$) deposited by chemical vapor deposition (CVD).

The pad layers 18a, 18b are patterned using lithography and etching and then used to form corresponding openings 17 extending into the device layer 12. The openings 17, which are arranged in a row, may be formed in the device layer 12 using a directional etching process, such as reactive ion etching (RIE), at the locations of the overlying openings in the patterned pad layers 18a, 18b.

A liner 19 is applied to the surfaces bordering the openings 17 and, in particular, to cover the section of each opening 17 in the device layer 12. The liner 19 may be composed of a material that is removable selective to the device layer 12, such as silicon dioxide ($SiO_2$) that is removable selective to silicon. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. Sections of the liner 19 are removed from the bottoms of the openings 17 with a directional etching process, such as reactive ion etching (RIE), which exposes the semiconductor material of the device layer 12 at the bottoms of the openings 17 and converts the liner 19 to a collar covering the sidewall of each of the openings 17. Following the etching process, the device layer 12 is covered by the liner 19 over a short vertical section of each opening 17.

Figure 3:
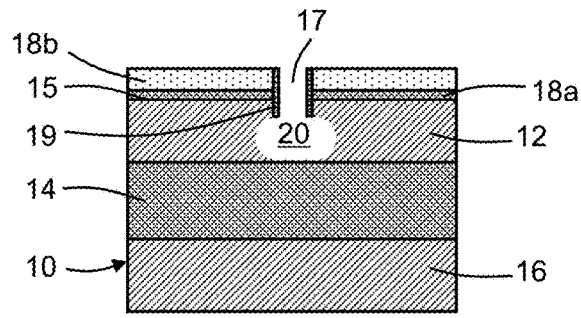
FIGS. 3 and 3A are cross-sectional views of the structure at a fabrication stage subsequent to FIGS. 2 and 2A.
Figure 3A:
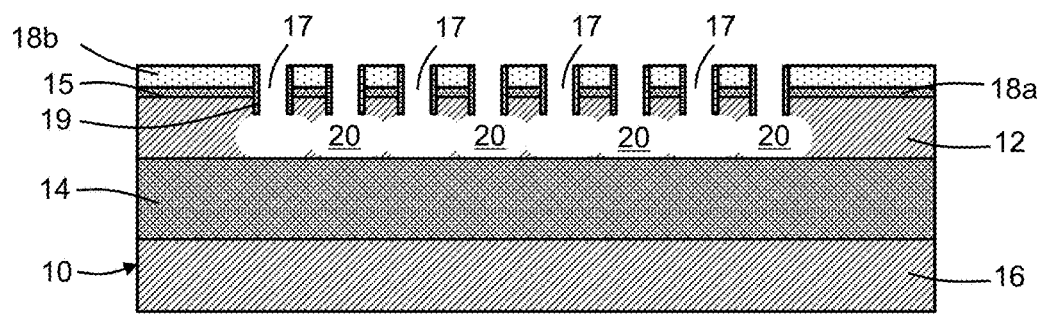

With reference to FIGS. 3, 3A in which like reference numerals refer to like features in FIGS. 2, 2A and at a subsequent fabrication stage of the processing method, cavities 20 are formed in the device layer 12 that extend outwardly from the bottoms of the openings 17. The cavities 20 may be formed by performing an isotropic etching process, and are merged together by the isotropic etching process. The isotropic etching process may be a dry etching process that uses xenon difluoride ($XeF_2$) as a source gas, and may stop on the top surface of the BOX layer 14. An overetch may be applied to ensure that areas on the top surface of the BOX layer 14 are exposed following the formation of the cavities 20. The liner 19 masks the openings 17 in the device layer and thereby prevents enlargement of the openings 17 by the etching process. The openings 17 are arranged in a vertical direction between the cavities 20 and the top surface 15 of the device layer 12. Due to the isotropic nature of the etching process, the cavities 20 may be centered about their respective openings 17.

Figure 4:
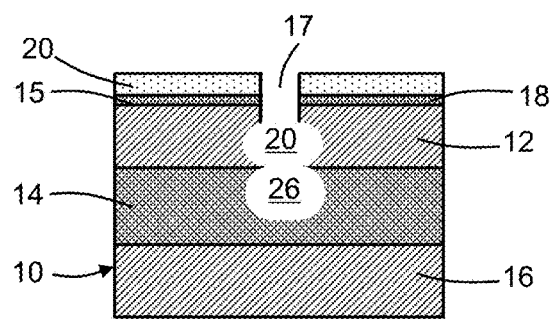
FIGS. 4 and 4A are cross-sectional views of the structure at a fabrication stage subsequent to FIGS. 3 and 3A.
Figure 4A:
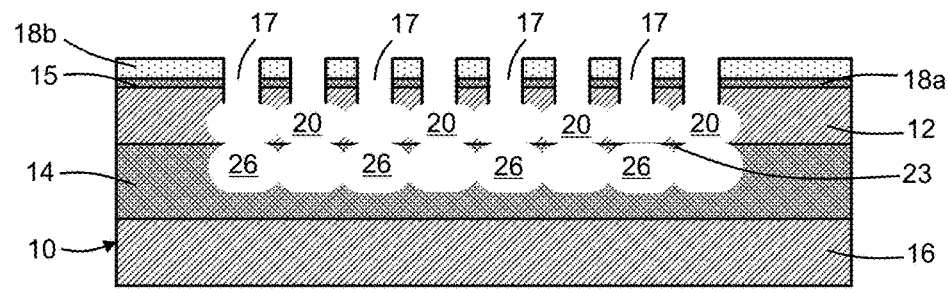

With reference to FIGS. 4, 4A in which like reference numerals refer to like features in FIGS. 3, 3A and at a subsequent fabrication stage of the processing method, cavities 26 are formed in the BOX layer 14 that extend vertically from the bottoms of the cavities 20. The cavities 26 may be formed by performing an isotropic etching process, and are merged together by the isotropic etching process. The isotropic etching process may be a wet chemical etching process that uses a hydrofluoric acid (HF) solution, and that removes the material of the BOX layer 14 selective to the material of the device layer 12. The liner 19 may also be removed by the isotropic etching process. The cavities 26 are stacked with the cavities 20, and the cavities 20 are arranged in a vertical direction between the cavities 26 and the top surface 15 of the device layer 12. Ribs 23 composed of the material of the device layer 12 and/or the material of the BOX layer 14 may be located at the interface between the device layer 12 and the BOX layer 14. The ribs 23 may provide or contribute to a support framework that compensates for any loss in mechanical strength arising from cavity formation.

Figure 5:
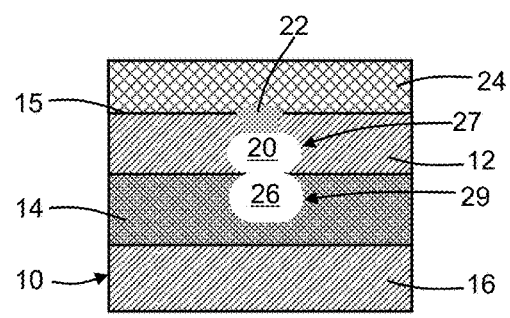
FIGS. 5 and 5A are cross-sectional views of the structure at a fabrication stage subsequent to FIGS. 4 and 4A.
Figure 5A:
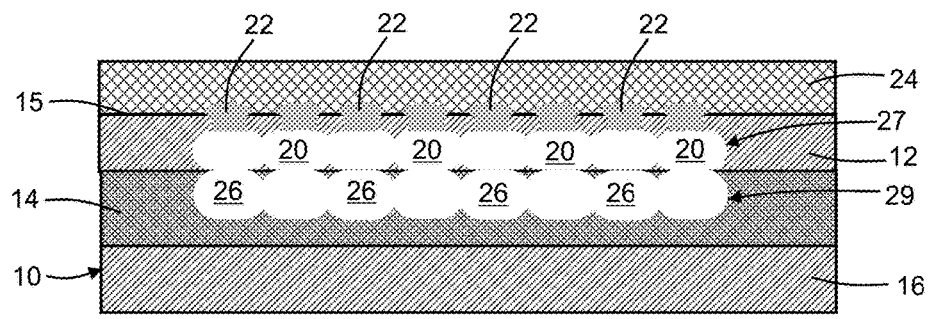

With reference to FIGS. 5, 5A in which like reference numerals refer to like features in FIGS. 4, 4A and at a subsequent fabrication stage of the processing method, the pad layers 18a, 18b are removed after the openings 17, cavities 20, and cavities 26 are formed. A bake may be performed at a temperature of, for example, 800° C. in a reducing atmosphere (e.g., hydrogen) to remove native oxide from the semiconductor material of the device layer 12 bordering the openings 17 and cavities 20.

Plugs 22 are formed inside the openings 17 that close and seal the cavities 20. To that end, a thin conformal layer of a semiconductor material, such as silicon-germanium (SiGe), may be epitaxially grown as a liner on the surfaces of the device bordering the openings 17 and cavities 20. The thickness of the thin conformal layer is selected such that the openings 17 are not pinched-off. An epitaxial layer 24, which may be composed of a different semiconductor material (e.g., silicon) than the thin conformal layer, may then be epitaxially grown on the top surface 15 of the device layer 12. The epitaxial layer 24 may be formed using a low temperature epitaxial (LTE) growth process, such as vapor phase epitaxy (VPE). During epitaxial growth, the semiconductor material constituting the epitaxial layer 24 will acquire the crystal orientation and crystal structure of the single-crystal semiconductor material of the device layer 12, which serves as an epitaxial growth template establishing a crystal structure. The epitaxial growth may cause the thin conformal layer to reflow and combine with the semiconductor material of the epitaxial layer 24 to form the plugs 22 inside the openings 17 and beneath the epitaxial layer 24. In an embodiment, the epitaxial layer 24 may be grown at a temperature of 850° C. to 1000° C. In an embodiment, the epitaxial layer 24 may be in direct contact with the top surface 15 of the device layer 12. The epitaxial layer 24 is self-planarized, and may have a thickness selected to optimize its waveguide properties. Specifically, the epitaxial layer 24 conforms to the shape of the top surface of the plugs 22, which is illustrated as a convex shape in the representative embodiment but also may have a planar or concave shape.

The merged and sealed cavities 20 define an airgap 27 in the device layer 12 and an airgap 29 from the merged cavities 26 in the BOX layer 14. The airgaps 27, 29 may be characterized by a permittivity or dielectric constant of near unity (i.e., vacuum permittivity). The airgaps 27, 29 may be filled by atmospheric air at or near atmospheric pressure, may be filled by another gas at or near atmospheric pressure, or may contain atmospheric air or another gas at a sub-atmospheric pressure (e.g., a partial vacuum).

Figure 6:
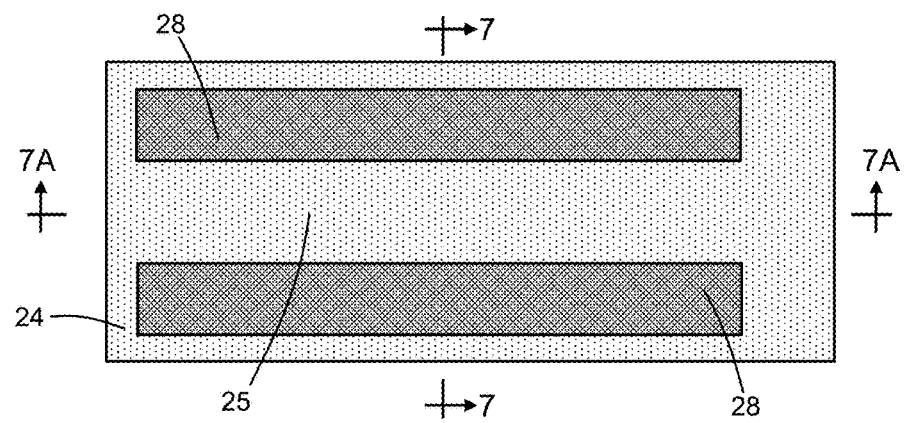
FIG. 6 is a top view of the structure at a fabrication stage subsequent to FIGS. 5, 5A.
Figure 7:
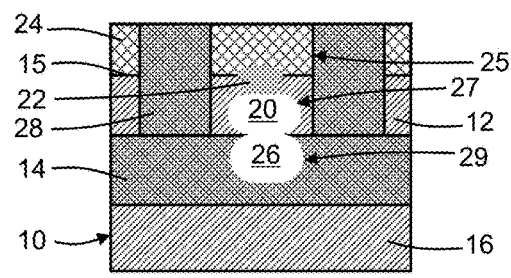
FIG. 7 is a cross-sectional view taken generally along line 7-7 in FIG. 6.
Figure 7A:
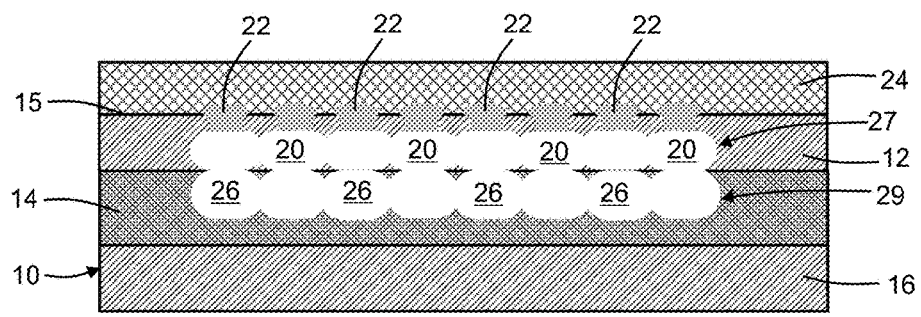
FIG. 7A is a cross-sectional view taken generally along line 7A-7A in FIG. 6.

With reference to FIGS. 6, 7, 7A in which like reference numerals refer to like features in FIGS. 5, 5A and at a subsequent fabrication stage of the processing method, shallow trench isolation regions 28 are formed that penetrate through the epitaxial layer 24 and the device layer 12 to the planar interface between the device layer 12 and the BOX layer 14. The shallow trench isolation regions 28 may be composed of a dielectric material, such as an oxide of silicon (e.g., silicon dioxide ($SiO_2$)), deposited by chemical vapor deposition (CVD) into trenches etched by a masked etching process. The shallow trench isolation regions 28 have a parallel arrangement, and the airgap 27 is arranged in the device layer 12 horizontally between the shallow trench isolation regions 28. The airgap 29 is arranged in the BOX layer 14 vertically below and horizontally between the shallow trench isolation regions 28.

The section of the epitaxial layer 24, the section of the device layer 12 above the merged cavities 20 forming the airgap 27 and merged cavities 26 forming the airgap 29, and the plugs 22 may collectively constitute a waveguide core region 25 of a waveguide, and the waveguide core region 25 is arranged horizontally between the shallow trench isolation regions 28 and that is arranged vertically over the airgap 27. In the representative embodiment, the airgap 27 and the airgap 29 are both arranged directly under the waveguide core region 25.

Figure 8:
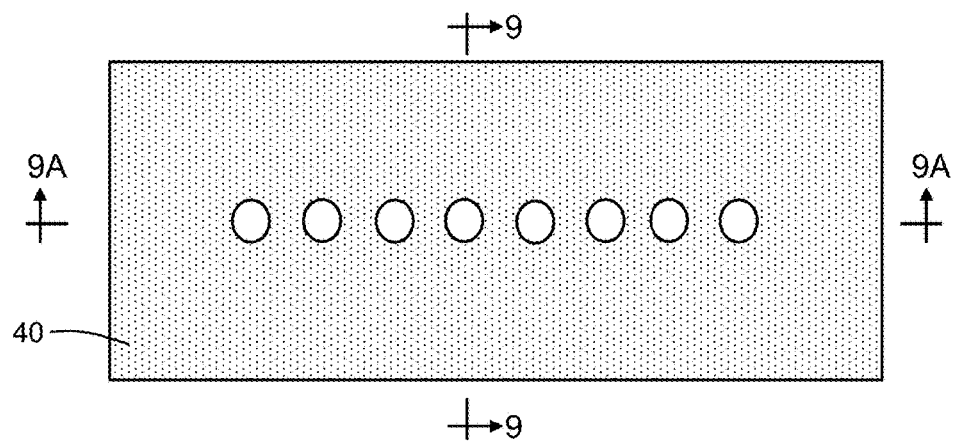
FIG. 8 is a top view of the structure at a fabrication stage subsequent to FIG. 6.
Figure 9:
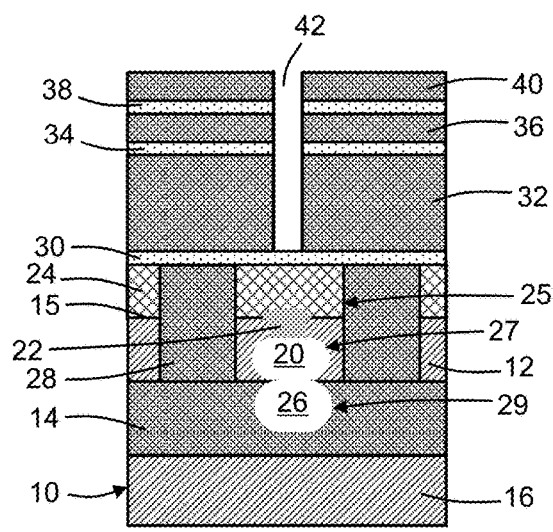
FIG. 9 is a cross-sectional view taken generally along line 9-9 in FIG. 8.
Figure 9A:
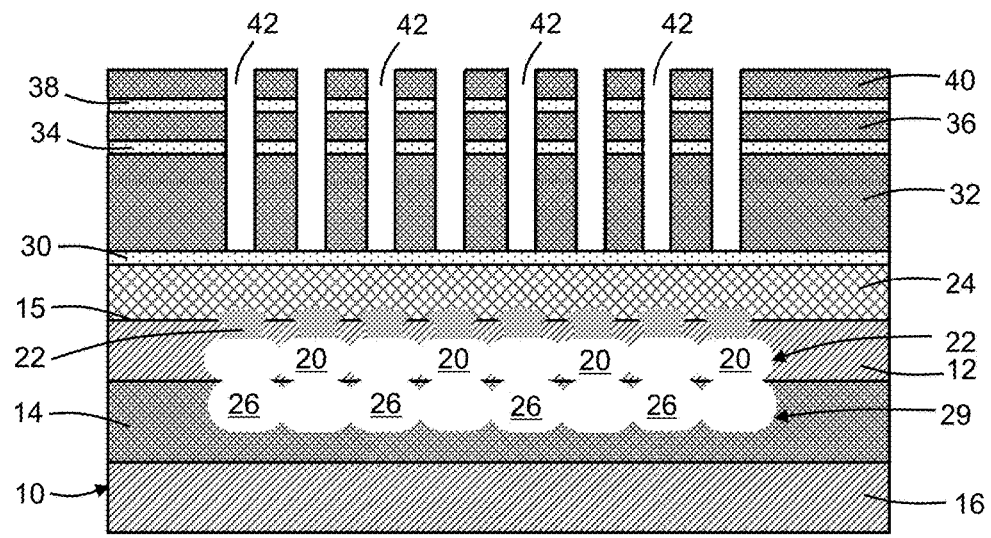
FIG. 9A is a cross-sectional view taken generally along line 9A-9A in FIG. 8.

With reference to FIGS. 8, 9, 9A in which like reference numerals refer to like features in FIGS. 6, 7, 7A and at a subsequent fabrication stage of the processing method, dielectric layers 30, 32, 34, 36, 38, 40 are formed in a layer stack over the epitaxial layer 24. The dielectric layers 30, 34, 38 may be composed of a dielectric material, and the dielectric layers 32, 36, 40 may be composed of a different dielectric material that can be removed selective to the dielectric material of the dielectric layers 30, 34, 38. In an embodiment, the dielectric layers 30, 34, 38 may be composed of silicon nitride ($Si_3N_4$) deposited by chemical vapor deposition (CVD), and the dielectric layers 32, 36, 40 may be composed of silicon dioxide ($SiO_2$) deposited by chemical vapor deposition (CVD). The dielectric layer 30 may be a barrier layer, and contacts (not shown) may be formed at other locations in the dielectric layer 32 by middle-of-line processing. The dielectric layer 34 may be a barrier layer, and contacts and wires (not shown) may be formed at other locations in the dielectric layer 36 by back-end-of-line processing. The dielectric layers 38 and 40 may function to promote the formation of additional airgaps, as discussed below.

After the layer stack is formed, via openings 42 are etched that extend through the dielectric layers 32, 34, 36, 38, 40 to the top surface of the dielectric layer 30. The via openings 42, which are arranged in a row, may be patterned using lithography to form an etch mask and etching with a directional etching process, such as reactive ion etching (RIE). The dielectric layer 30 may function as an etch stop when etching the dielectric layer 32 to form the via openings 42.

Figure 10:
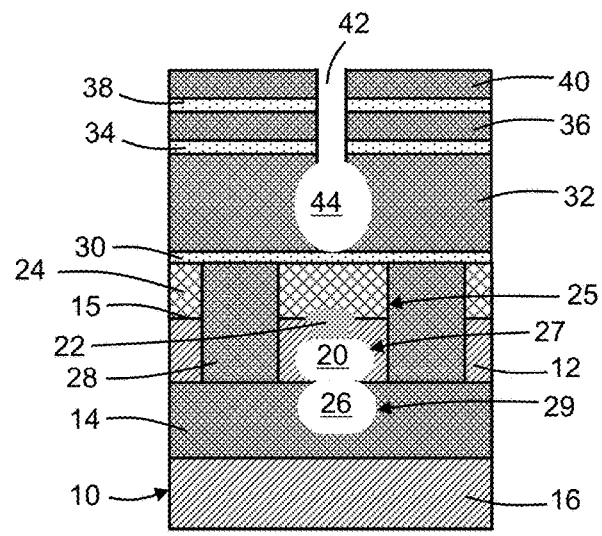
FIGS. 10 and 10A are cross-sectional views of the structure at a fabrication stage subsequent to FIGS. 9 and 9A.
Figure 10A:
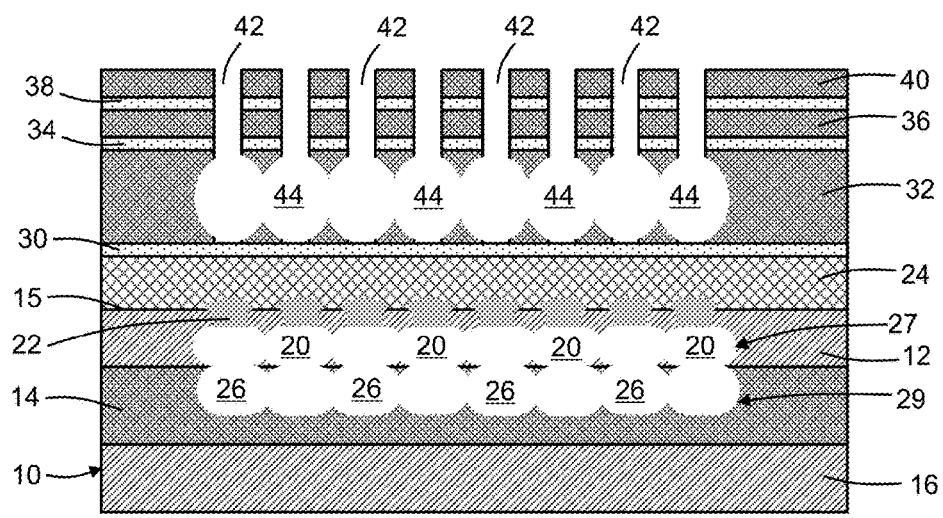

With reference to FIGS. 10, 10A in which like reference numerals refer to like features in FIGS. 9, 9A and at a subsequent fabrication stage of the processing method, cavities 44 are formed in the dielectric layer 32 that extend outwardly from the portion of the via openings 42 in dielectric layer 32. The cavities 44 may be formed by performing an isotropic etching process. The cavities 44 may be merged by the isotropic etching process. The isotropic etching process may be a dry etching process that isotropically removes the dielectric material (e.g., silicon dioxide) of the dielectric layer 32 selective to the dielectric materials (e.g., silicon nitride) of the underlying dielectric layer 30 and the overlying dielectric layer 34 that are adjacent to dielectric layer 32. Due to the isotropic nature of the etching process, the cavities 44 are centered about their respective openings 42. After the cavities 44 are formed, the epitaxial layer 24 is arranged in a vertical direction between the cavities 20 in the device layer 12 and the cavities 44 in the dielectric layer 32. The isotropic etching process forming the cavities 44 may also form small cavities (not shown) in the dielectric layer 36.

Figure 11:
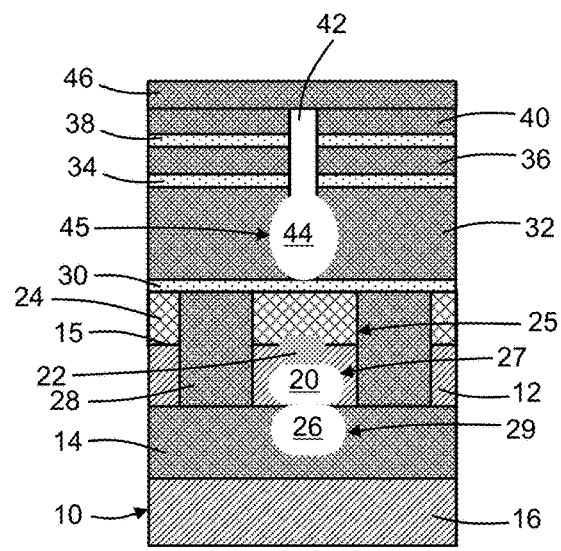
FIGS. 11 and 11A are cross-sectional views of the structure at a fabrication stage subsequent to FIGS. 10 and 10A.
Figure 11A:
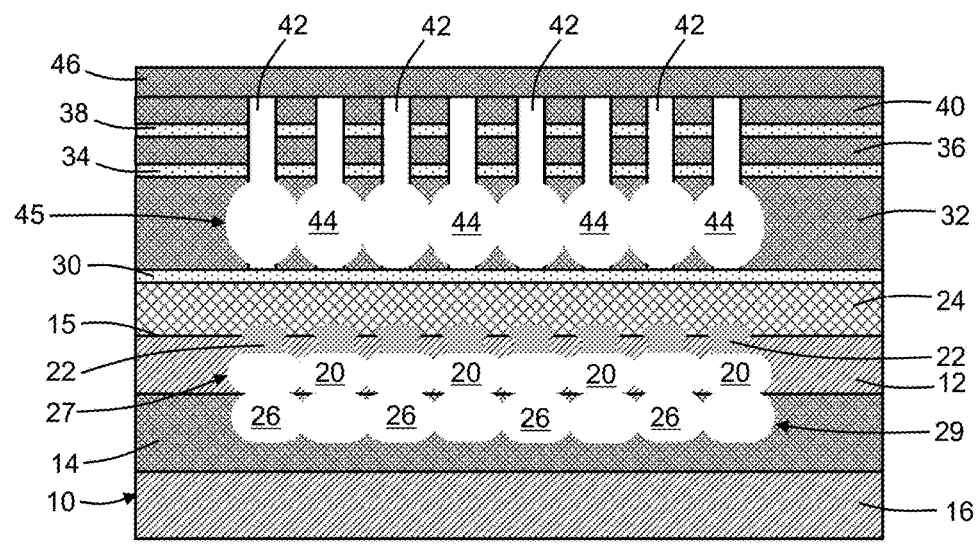

With reference to FIGS. 11, 11A in which like reference numerals refer to like features in FIGS. 10, 10A and at a subsequent fabrication stage of the processing method, a dielectric layer 46 is formed over the dielectric layer 38. The dielectric layer 46 may include divots (not shown) at the locations of the via openings 42 because the via openings 42 are not plugged before the dielectric layer 46 is deposited.

The dielectric layer 46 closes and seals the via openings 42 such that the merged cavities 44 define an airgap 45 that may be characterized by a permittivity or dielectric constant of near unity (i.e., vacuum permittivity). The airgap 45 may be filled by atmospheric air at or near atmospheric pressure, may be filled by another gas at or near atmospheric pressure, or may contain atmospheric air or another gas at a sub-atmospheric pressure (e.g., a partial vacuum). In an embodiment, the dielectric layer 46 may be composed of silicon dioxide ($SiO_2$) deposited by chemical vapor deposition (CVD).

The waveguide core region 25 is arranged in a vertical direction between the airgaps 27, 29 and the airgap 45. More specifically, the airgaps 27, 29 are arranged under the waveguide core region 25 in the vertical direction and the airgap 45 is arranged over the waveguide core region 25 in the vertical direction. In the representative embodiment, the airgaps 27, 29 are arranged directly under the waveguide core region 25 with the airgap 27 between the airgap 29 and the waveguide core region 25, and the airgap 45 is arranged directly over the waveguide core region 25. The waveguide structure includes the waveguide core region 25, the trench isolation regions 28 adjacent to the waveguide core region 25, the airgaps 27, 29 arranged under (i.e., beneath) the waveguide core region 25, and the airgap 45 arranged over the waveguide core region 25.

Figure 12:
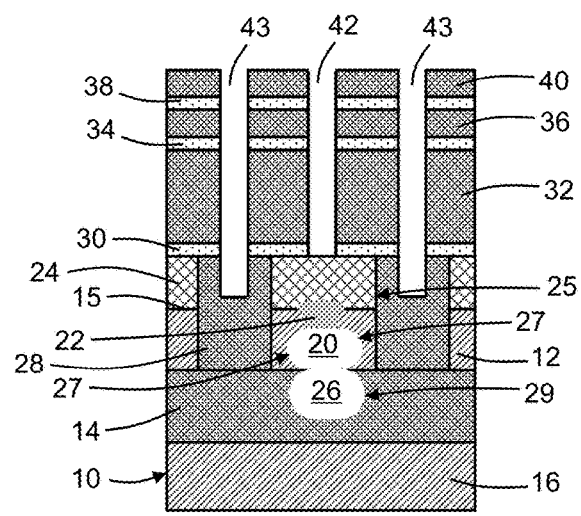
FIGS. 12 and 13 are cross-sectional views of a structure at successive fabrication stages of a processing method in accordance with alternative embodiments of the invention.

With reference to FIG. 12 in which like reference numerals refer to like features in FIG. 9 and in accordance with alternative embodiments of the invention, additional via openings 43 may be formed that extend into, but not through, each of the shallow trench isolation regions 28. The via openings 43, which are arranged in a respective row in each of the shallow trench isolation regions 28 similar to the via openings 42, may be formed concurrently with the via openings 42. To access the shallow trench isolation regions 28, the via openings 43 are etched through the dielectric layer 30, and the via openings 42 are also etched through the dielectric layer 30 instead of stopping on its top surface. After penetrating through the dielectric layer 30, the etching of the via openings 42 may stop on the semiconductor material of the epitaxial layer 24, whereas the etching of the via openings 43 may be extended to penetrate into the shallow trench isolation regions 28 with an etching process that removes the dielectric material of the shallow trench isolation regions 28 selective to the semiconductor material of the epitaxial layer 24.

Figure 13:
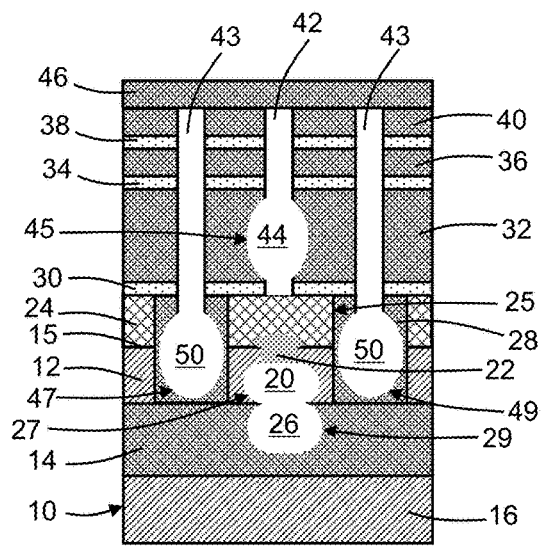

With reference to FIG. 13 in which like reference numerals refer to like features in FIG. 12 and at a subsequent fabrication stage of the processing method, cavities 50 may be formed in the shallow trench isolation regions 28 by the isotropic etching process forming the cavities 44. The cavities 50 extend outwardly from the respective portions of the via openings 43 in the shallow trench isolation regions 28 and are merged together within the shallow trench isolation regions 28 by the isotropic etching process. The partial removal of the dielectric material of the shallow trench isolation regions 28 and replacement with airgaps in the cavities 50 operates to reduce the volume of silicon dioxide surrounding the waveguide.

Processing continues with the formation of the dielectric layer 46, which seals the cavities 50 to form an airgap 47 in one of the shallow trench isolation regions 28 and another airgap 49 in the other of the shallow trench isolation regions 28. The waveguide structure includes the waveguide core region 25, the trench isolation regions 28 and airgaps 47, 49 adjacent to the waveguide core region 25, the airgaps 27, 29 arranged under (i.e., beneath) the waveguide core region 25, and the airgap 45 arranged over the waveguide core region 25.

Figure 14:
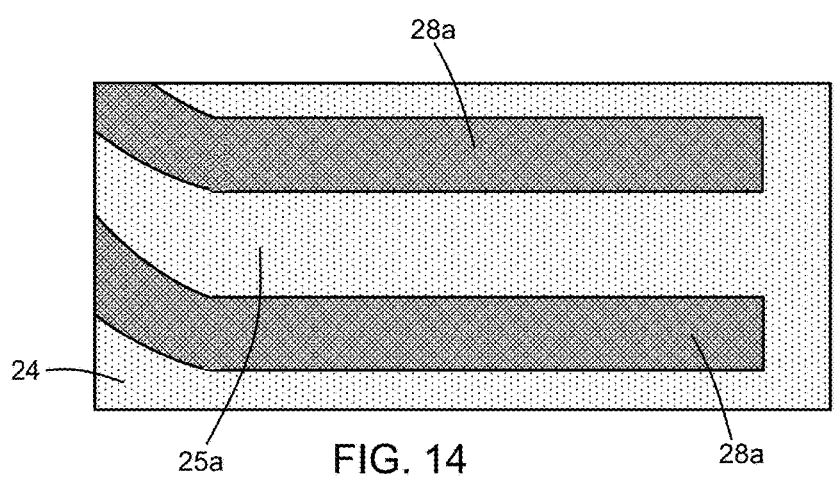
FIG. 14 is a top view of a structure similar to FIG. 6 at a fabrication stage of a processing method in accordance with alternative embodiments of the invention.

With reference to FIG. 14 in which like reference numerals refer to like features in FIG. 6 and in accordance with alternative embodiments of the invention, shallow trench isolation regions 28a are formed that penetrate through the epitaxial layer 24 and the device layer 12 to the planar interface between the device layer 12 and the BOX layer 14. The shallow trench isolation regions 28a replace shallow trench isolation regions 28 and are formed in the same manner. The shallow trench isolation regions 28a have a given curvature over a given portion of their length such that the flanked waveguide core region 25a has a linear segment that adjoins a curved segment following the curvature of the shallow trench isolation regions 28a. The subsequently-formed cavities 20 and plugs 22 are located in the device layer 12 and the subsequently-formed cavities 26 are located in the BOX layer 14 with respective layouts established by the arrangement of the openings 17 in the linear and curved segments of the waveguide core region 25a, and are arranged below the waveguide core region 25a.

Processing continues as described in connection with FIGS. 9, 9A through FIGS. 11, 11. The cavities 44 in the dielectric layer 32 will also be arranged over the waveguide core region 25a with an arrangement established by the layout of the via openings 42. If the optional cavities 50 are formed in the shallow trench isolation regions 28a, then the arrangement of these cavities 50 will follow the shape of the shallow trench isolation regions 28a and the linear and curved segments of the waveguide core region 25a.

Figure 15:
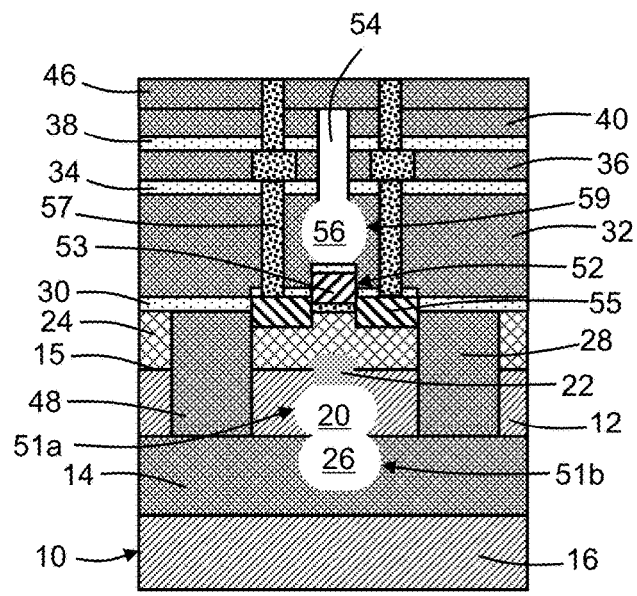
FIG. 15 is a cross-sectional view of a structure fabricated in accordance with alternative embodiments of the invention.

With reference to FIG. 15 in which like reference numerals refer to like features in FIG. 11 and in accordance with alternative embodiments of the invention, a pair of the cavities 20 and 26, as well as an associated plug 22, may be formed in a different region of the SOI substrate 10 that is not associated with the waveguide core region 25. When the epitaxial layer 24 is grown, the plug 22 is formed, as described previously, to seal the cavities 20, 26 and respectively form airgap 51a in the device layer 12 and airgap 51b in the BOX layer 14 concurrently with the formation of the airgap 27. When the shallow trench isolation regions 28 are formed, shallow trench isolation regions 48 may be concurrently formed that surround a device region of the epitaxial layer 24 and the underlying portion of the device layer 12 that includes the cavity 20 and plug 22. The shallow trench isolation regions 48 extend through the epitaxial layer 24 and the device layer 12 to the interface between the device layer 12 and the BOX layer 14.

A device structure, generally indicated by reference numeral 52, may be formed by front-end-of-line (FEOL) processing using the device region of semiconductor material of the epitaxial layer 24 surrounded by the shallow trench isolation regions 48. For example, the device structure 52 may be a field-effect transistor that includes at least one gate finger composed of a gate electrode 53 and a gate dielectric formed by depositing a layer stack and patterning the layer stack with photolithography and etching. The gate electrode 53 may be composed of a conductor, such as doped polycrystalline silicon (i.e., polysilicon), and the gate dielectric may be composed of an electrical insulator, such as silicon dioxide ($SiO_2$). The field-effect transistor providing the device structure 52 in the representative embodiment may include other elements such as source/drain regions 55, silicide on the source/drain regions 55, halo regions, and lightly doped drain (LDD) extensions, as well as non-conductive sidewall spacers on each gate finger, and wires and contacts in the dielectric layers 30, 32, 34, 36, 38, 40 that are coupled with the gate electrode 53 and source/drain regions 55.

When the via openings 42 are formed, a via opening 54 may be formed that extends to the device structure 52. When the cavities 44 are formed, a cavity 56 may be formed in the dielectric layer 32 that is arranged above the device structure 52. After the via openings 54 and cavity 56 are formed, the formation of the dielectric layer 46 operates to close and seal the cavity 56 to form an airgap 59. The airgap 59 is arranged over the device structure 52 and the airgap 51 is arranged beneath the device structure 52, which may improve the performance of the device structure 52 by lowering the parasitic capacitance and harmonic distortion. The sets of merged cavities 20, 26, 56 and their respective airgaps 51a, 51b, 59 that are associated with the device structure 52 are concurrently formed, in each instance, along with the sets of merged cavities 20, 26, 44 and their respective airgaps 27, 29, 45 that are associated with the waveguide core region 25.

Contacts 57 may be formed in additional via openings extending in a vertical direction through the dielectric layer 32 to the device structure 52. For example, the contacts 57 may extend to the source/drain regions 55 of the device structure 52. Additional contacts and metal wires (not shown) may be formed in the dielectric layers 34, 36, 38, 40, and dielectric layer 46 that are coupled with the contacts 57 in order to establish vertical interconnects.

Figure 16:
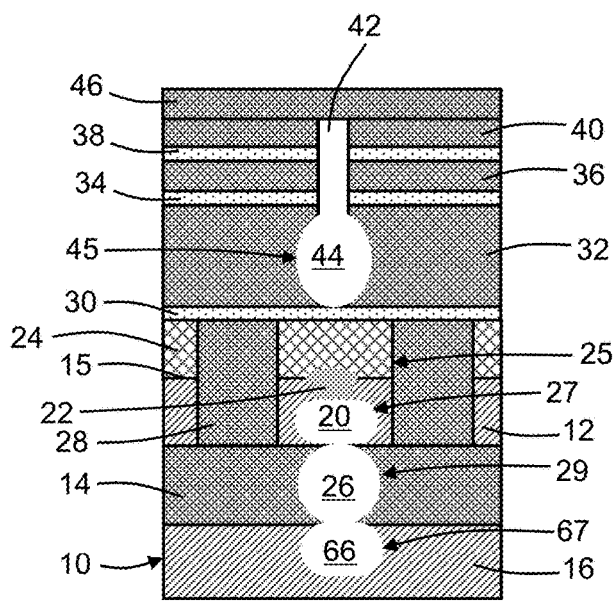
FIG. 16, 16A are cross-sectional views of a structure in accordance with alternative embodiments of the invention.
Figure 16A:
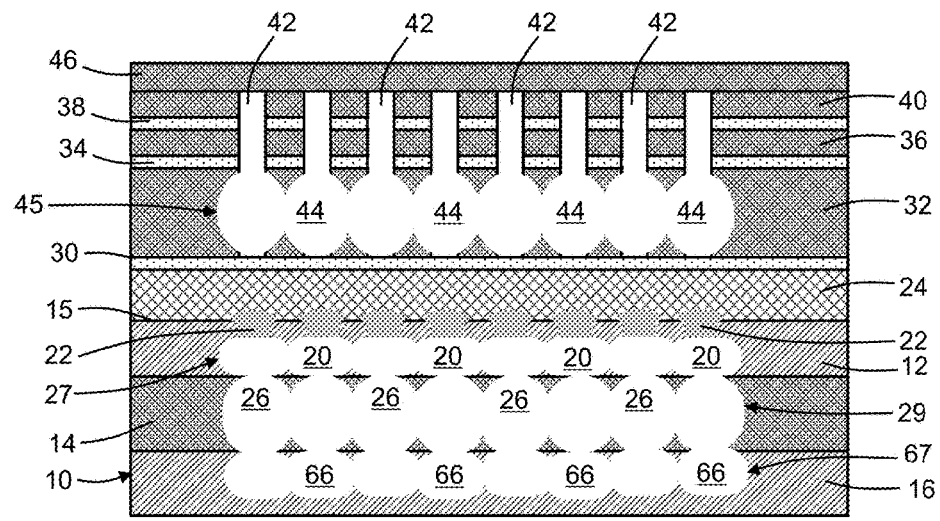
Figure 17:
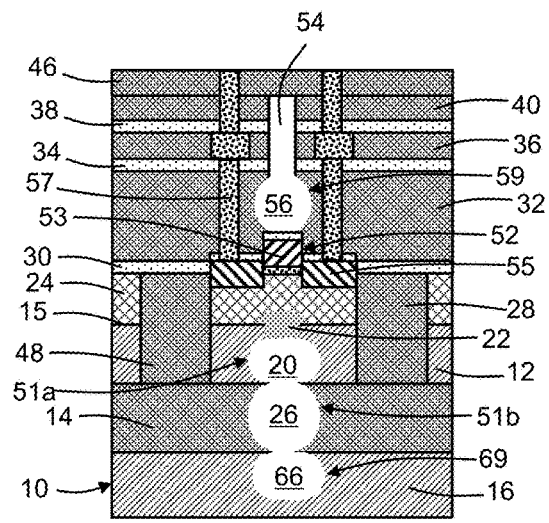
FIG. 17 is a cross-sectional view of a structure in accordance with alternative embodiments of the invention.

With reference to FIGS. 16, 16A, and 17 in which like reference numerals refer to like features in FIG. 13 and in accordance with alternative embodiments of the invention, before forming the epitaxial layer 24 and plugs 22, the cavities 26 may be extended in depth within the BOX layer 14 by the isotropic etching process to the planar interface between the BOX layer 14 and handle wafer 16. A liner (not shown) similar to liner 19 may be applied to the device layer 12 bordering the cavities 20, and an isotropic etching process that removes the semiconductor material of the handle wafer 16 selective to the dielectric material of the BOX layer 14 may be used to form additional cavities 66 in the handle wafer 16 that are merged. The cavities 66 are arranged below the cavities 20 and 26, and also below the waveguide core region 25, and may operate to further decrease optical leakage from the waveguide core region 25.

Processing continues with the formation of the epitaxial layer 24 and plugs 22, which also seals the cavities 66 to form an airgap 67 in the handle wafer 16, and subsequent fabrication stages. The airgaps 27 and 29 are arranged in a vertical direction between the airgap 67 and the waveguide core region 25. The waveguide structure includes the waveguide core region 25, the trench isolation regions 28 adjacent to the waveguide core region 25, the airgaps 27, 29, 67 arranged under (i.e., beneath) the waveguide core region 25, and the airgap 45 arranged over the waveguide core region 25. The waveguide structure may further include the airgaps 47, 49 in the trench isolation regions 28 that are adjacent to the waveguide core region 25.

As best shown in FIG. 17, a cavity 66 may also be formed in the same manner beneath the cavity 26 in the device region used to form the device structure 52. When the plug 22 is formed, an airgap 69 is defined in the handle wafer 16 beneath the device structure 52. The airgaps 51a and 51b are arranged in a vertical direction between the airgap 69 and the device structure 52.

Figure 18:
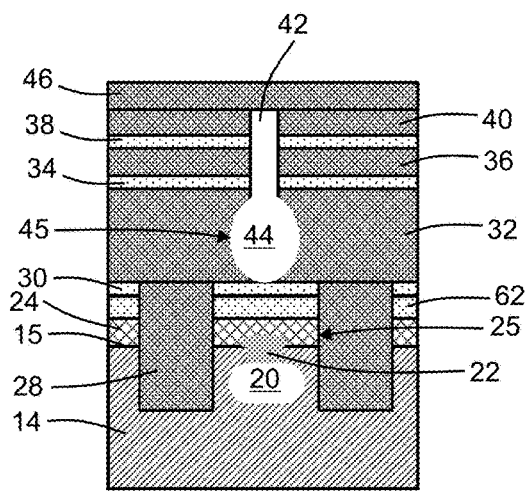
FIG. 18, 18A are cross-sectional views of a structure in accordance with alternative embodiments of the invention.
Figure 18A:
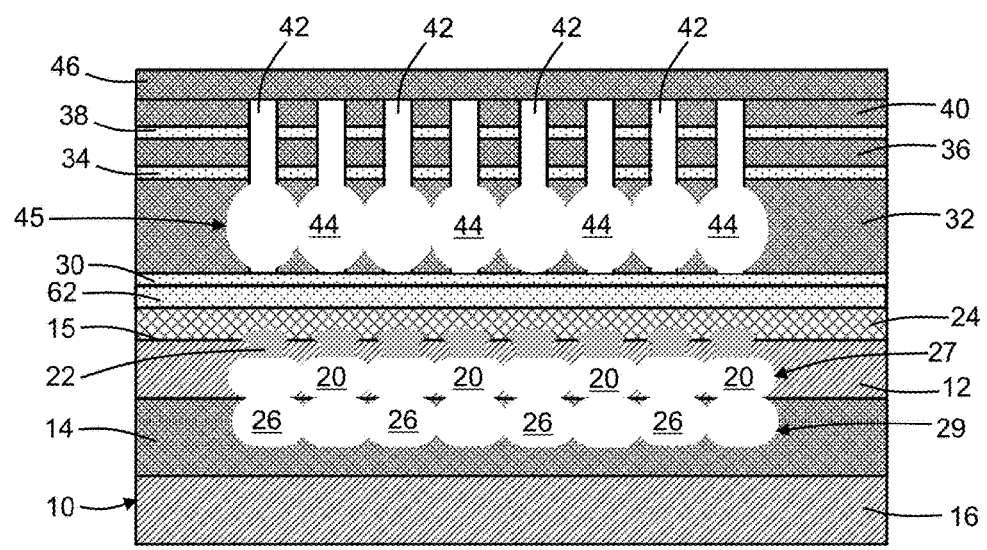

With reference to FIGS. 18, 18A in which like reference numerals refer to like features in FIG. 11 and in accordance with alternative embodiments of the invention, an epitaxial layer 62 may be formed over the epitaxial layer 24, and may be composed of a different semiconductor material than the epitaxial layer 24. In an embodiment, the epitaxial layer 62 may have an index of refraction that is greater than the index of refraction of the epitaxial layer 24. In an embodiment, the epitaxial layer 24 may be composed of silicon, and the epitaxial layer 62 may be composed of silicon-germanium. The germanium content in the composition of the epitaxial layer 62 and the thickness of the epitaxial layer 62 may be tuned to vary the index of refraction of the epitaxial layer 62 and provide a change in the composite index of refraction of the waveguide core region 25 that includes both of the epitaxial layers 24, 62.

Figure 19:
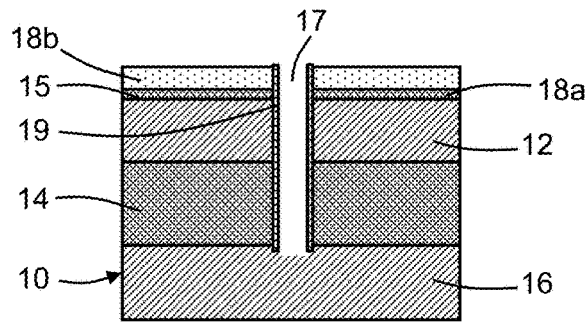
FIGS. 19-21 are cross-sectional views of a structure at successive fabrication stages of a processing method in accordance with alternative embodiments of the invention.

With reference to FIG. 19 in which like reference numerals refer to like features in FIG. 2 and in accordance with alternative embodiments of the invention, the directional etching process, such as reactive ion etching (ME), is used to extend the openings 17 through the full thickness of the device layer 12 to the planar interface between the device layer 12 and the BOX layer 14 so that surface areas of the BOX layer 14 are exposed at the bottoms of the openings 17. The etching process may stop on the dielectric material of the BOX layer 14. Another directional etching process is used to extend the openings 17 through the full thickness of the BOX layer 14 to the planar interface between the BOX layer 14 and the handle wafer 16 so that surface areas of the handle wafer 16 are exposed at the bottoms of the openings 17. The etching process may stop on the semiconductor material of the handle wafer 16 and may remove the dielectric material of the BOX layer 14 selective to the semiconductor material of the device layer 12.

The liner 19 is then applied to the surfaces bordering the openings 17, and sections of the liner 19 are removed from the bottoms of the openings 17 with a directional etching process, such as reactive ion etching (RIE), which converts the liner 19 to a collar covering the sidewall of each of the openings 17. Following the etching process, the device layer 12 is covered by the liner 19 inside each opening 17, and the semiconductor material of the handle wafer 16 is exposed over respective surface areas at the bottoms of the openings 17.

Figure 20:
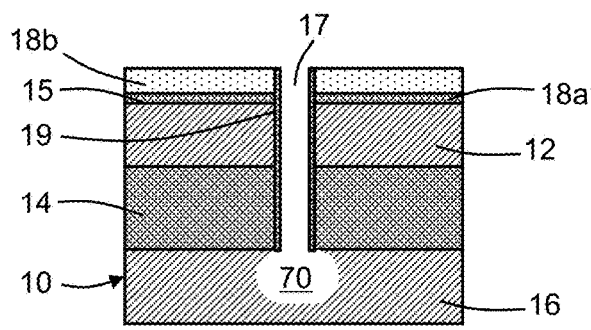

With reference to FIG. 20 in which like reference numerals refer to like features in FIG. 19 and at a subsequent fabrication stage of the processing method, cavities 70 similar to cavities 66 (FIGS. 16, 16A) are formed in the handle wafer 16 and merged by an isotropic etching process that removes the semiconductor material of the handle wafer 16 selective to the dielectric material of the liner 19.

Figure 21:
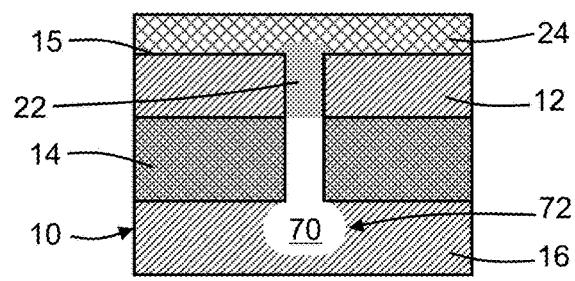

With reference to FIG. 21 in which like reference numerals refer to like features in FIG. 20 and at a subsequent fabrication stage of the processing method, the liner 19 is removed from the openings 17 and the pad layers 18a, 18b are removed from the top surface of the device layer 12. For example, the material of the pad layer 18b may be removed selective to the materials of the pad layer 18a, liner 19, and handle wafer 16 with a wet chemical etching process, such as a hot phosphoric acid etch. The liner 19 and the pad layer 18a may be removed selective to the materials of the device layer 12 and the handle wafer 16 with a wet chemical etching process, such as a solution containing hydrofluoric acid. The section of the openings 17 may be increased slightly by the etching processes removing the liner 19 and the pad layer 18a.

The plugs 22 and epitaxial layer 24 are then formed to close and seal the merged cavities 70 so as to form an airgap 72 in the handle wafer 16. The vertical extent of the plugs 22 within the openings 17 may depend on factors such as the respective thicknesses of the device layer 12 and the BOX layer 14. In any event, the plugs 22 may extend vertically through the complete thickness of the BOX layer 14. The airgap 72 is arranged below the waveguide core region 25, and may operate to decrease optical leakage from the waveguide core region 25. Processing may continue with the formation of dielectric layers 30, 32, 34, 36, 38, 40 (FIGS. 8, 9, 9A) through the formation of the dielectric layer 46 (FIGS. 11, 11a) that seals and closes the via openings 42 to define the airgap 45.

Figure 22:
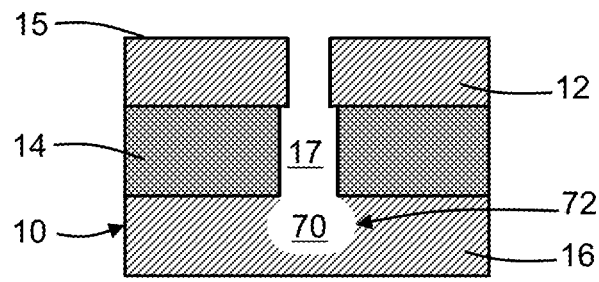
FIGS. 22-23 are cross-sectional views of a structure at successive fabrication stages of a processing method in accordance with alternative embodiments of the invention.

With reference to FIG. 22 in which like reference numerals refer to like features in FIG. 20 and in accordance with alternative embodiments of the invention, the etching process removing the liner 19 and pad layer 18a selective to the device layer 12 and handle wafer 16 may be extended to laterally etch and intentionally widen the section of each of the openings 17 in the BOX layer 14.

Figure 23:
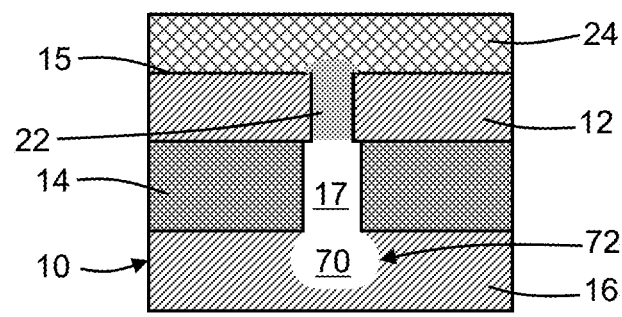

With reference to FIG. 23 in which like reference numerals refer to like features in FIG. 22 and at a subsequent fabrication stage of the processing method, the plugs 22 may occupy less than the entirety of the height of the widened section of each opening 17 in the BOX layer 14. The widened sections of the openings 17 are connected with the merged cavities 70 such that the dimensions of the airgap 72 are increased by addition of the widened sections of the openings 17.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A waveguide structure comprising:
   a semiconductor substrate including a device layer, a handle wafer, and a buried oxide layer between the handle wafer and the device layer;
   a first epitaxial semiconductor layer over the device layer;
   a first trench isolation region and a second trench isolation region extending through the device layer and the first epitaxial semiconductor layer to the buried oxide layer, the first trench isolation region spaced from the second trench isolation region to define a waveguide core region comprising a section of the device layer and a first section of the first epitaxial semiconductor layer that are arranged between the first trench isolation region and the second trench isolation region;
   a first airgap in the device layer or the handle wafer; and
   a second airgap in the buried oxide layer,
   wherein the first airgap and the second airgap are each arranged beneath the waveguide core region.

2. The waveguide structure of claim 1 further comprising:
   a third airgap in the first trench isolation region.

3. The waveguide structure of claim 2 further comprising:
   a fourth airgap in the second trench isolation region,
   wherein the waveguide core region is horizontally arranged between the third airgap and the fourth airgap.

4. The waveguide structure of claim 1 further comprising:
   a first dielectric layer over the waveguide core region; and
   a third airgap in the first dielectric layer, the third airgap arranged over the waveguide core region.

5. The waveguide structure of claim 1 wherein the first airgap is arranged in the device layer between the second airgap and the waveguide core region, and further comprising:
   a third airgap in the handle wafer,
   wherein the third airgap is arranged beneath the waveguide core region, and the first airgap and the second airgap are arranged between the third airgap and the waveguide core region.

6. The waveguide structure of claim 1 further comprising:
   a field-effect transistor including a gate electrode on a second section of the first epitaxial semiconductor layer; and
   a third airgap in the device layer, the third airgap arranged under the field-effect transistor.

7. The waveguide structure of claim 1 further comprising:
   a second epitaxial semiconductor layer over the first epitaxial semiconductor layer,
   wherein the second epitaxial semiconductor layer has a larger index of refraction than the first epitaxial semiconductor layer, and the waveguide core region includes a section of the second epitaxial semiconductor layer arranged between the first trench isolation region and the second trench isolation region.

8. The waveguide structure of claim 1 wherein the first trench isolation region and the second trench isolation region have a parallel arrangement.

9. The waveguide structure of claim 1 wherein the first trench isolation region and the second trench isolation region are curved over a lengthwise segment.

10. The waveguide structure of claim 1 wherein the first airgap is arranged in the device layer between the second airgap and the waveguide core region, and further comprising:
    a plurality of openings arranged between the first airgap and the first epitaxial semiconductor layer; and
    a plurality of plugs respectively arranged in the plurality of openings,
    wherein the plurality of plugs comprise respective portions of the waveguide core region.

11. A structure comprising:
    a semiconductor substrate including a device layer, a handle wafer, and a buried oxide layer arranged between the handle wafer and the device layer;
    an epitaxial semiconductor layer over the device layer;
    a field-effect transistor including a gate electrode on the epitaxial semiconductor layer;
    a first airgap in the device layer; and
    a second airgap in the buried oxide layer,
    wherein the first airgap and the second airgap are each arranged under the field-effect transistor, and the first airgap is arranged between the second airgap and the field-effect transistor.

12. The structure of claim 11 further comprising:
    a first dielectric layer over the field-effect transistor; and
    a third airgap in the first dielectric layer, the third airgap arranged over the field-effect transistor.

13. The structure of claim 12 further comprising:
    a second dielectric layer over the first dielectric layer;
    a plurality of openings extending through the second dielectric layer to the second airgap; and
    a third dielectric layer over the second dielectric layer and the plurality of openings in the second dielectric layer.

14. A method of forming a waveguide structure, the method comprising:
    providing a substrate including a device layer, a handle wafer, and a buried oxide layer arranged between the handle wafer and the device layer;
    forming a first airgap in the device layer or in the handle wafer;

after forming the first airgap, forming a second airgap in the buried oxide layer;

epitaxially growing a semiconductor layer over the device layer; and forming a first trench isolation region and a second trench isolation region each extending through the semiconductor layer and the device layer to the buried oxide layer, wherein the first trench isolation region is spaced from the second trench isolation region to define a waveguide core region comprising a section of the device layer and a first section of the semiconductor layer that are arranged between the first trench isolation region and the second trench isolation region, and the first airgap and the second airgap are arranged beneath the waveguide core region.

15. The method of claim 14 wherein the first airgap is formed in the device layer, the first airgap is arranged between the second airgap and the waveguide core region, and forming the first airgap in the device layer comprises:

etching, with an anisotropic etching process, a plurality of openings that extend into the device layer; and etching, with a first isotropic etching process, portions of the device layer below the plurality of openings to form a first plurality of cavities that are merged to define the first airgap.

16. The method of claim 15 wherein forming the second airgap in the buried oxide layer comprises:

etching, with a second isotropic etching process, portions of the buried oxide layer below the first plurality of cavities to form a second plurality of cavities in the buried oxide layer that are merged to define the second airgap.

17. The method of claim 14 wherein the first airgap is formed in the device layer, the first airgap is arranged between the second airgap and the waveguide core region, and further comprising:

forming a third airgap in the handle wafer, wherein the third airgap is arranged beneath the waveguide core region, and the first airgap and the second airgap are arranged between the third airgap and the waveguide core region.

18. The method of claim 14 further comprising:

forming a third airgap and a fourth airgap respectively in the first trench isolation region and the second trench isolation region, wherein the waveguide core region is arranged between the third airgap and the fourth airgap.

19. The method of claim 14 wherein the first airgap is formed in the handle wafer, and the second airgap is arranged between the first airgap and the waveguide core region.

20. The method of claim 14 further comprising:

forming a gate electrode of a field-effect transistor on a second section of the device layer;

forming a third airgap in the device layer that is arranged under the field-effect transistor; and forming a fourth airgap in the buried oxide layer, wherein the third airgap is arranged between the fourth airgap and the field-effect transistor.

* * * * *